United States Patent
Hattori et al.

(10) Patent No.: US 10,356,944 B2
(45) Date of Patent: Jul. 16, 2019

(54) LIQUID-ENCAPSULATION HEAT DISSIPATION MEMBER

(71) Applicant: POLYMATECH JAPAN CO., LTD., Saitama (JP)

(72) Inventors: Yusuke Hattori, Saitama (JP); Jun Ishizawa, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 296 days.

(21) Appl. No.: 15/032,357

(22) PCT Filed: Sep. 19, 2014

(86) PCT No.: PCT/JP2014/074798
§ 371 (c)(1),
(2) Date: Apr. 27, 2016

(87) PCT Pub. No.: WO2015/064240
PCT Pub. Date: May 7, 2015

(65) Prior Publication Data
US 2016/0278237 A1    Sep. 22, 2016

(30) Foreign Application Priority Data
Oct. 29, 2013 (JP) ................ 2013-224051

(51) Int. Cl.
*H05K 7/20* (2006.01)
*G06F 1/20* (2006.01)
(Continued)

(52) U.S. Cl.
CPC .......... *H05K 7/20263* (2013.01); *F28F 3/02* (2013.01); *F28F 9/001* (2013.01); *F28F 21/06* (2013.01);
(Continued)

(58) Field of Classification Search
CPC ........ H05K 7/20263; F28F 3/02; F28F 23/00; F28F 2255/02
(Continued)

(56) References Cited

U.S. PATENT DOCUMENTS 4,254,431 A * 3/1981 Babuka ............... H01L 23/3733
165/185
5,323,292 A * 6/1994 Brzezinski .......... H01L 23/3675
165/104.33
(Continued)

FOREIGN PATENT DOCUMENTS

CN    2656925 Y    11/2004
CN    1800766 A    7/2006
(Continued)

OTHER PUBLICATIONS

Office Action from Chinese Patent App. No. 201480059137.2 dated (Dec. 20, 2017).
(Continued)

*Primary Examiner* — Devon Russell
(74) *Attorney, Agent, or Firm* — Cermak Nakajima & McGowan LLP; Tomoko Nakajima

(57) ABSTRACT

A liquid-encapsulation heat dissipation member is prepared by encapsulating a thermally conductive fluid in a closed container nd dissipates heat transferred from an electronic device in contact with the closed container, wherein the closed container includes an elastic portion composed of a thin elastomer serving as a surface to come into contact with the electronic device and following the shape of the electronic device and a heat dissipation portion composed of a hard material for dissipating heat, and the thermally conductive fluid contains a thermally conductive powder and has a viscosity of 200,000 mPa·s to 3,000,000 mPa·s.

5 Claims, 6 Drawing Sheets

(51) Int. Cl.
*F28F 3/02* (2006.01)
*F28F 9/00* (2006.01)
*F28F 21/06* (2006.01)
*F28F 23/00* (2006.01)
*F28D 15/00* (2006.01)
*F28F 3/12* (2006.01)

(52) U.S. Cl.
CPC ............. *F28F 23/00* (2013.01); *G06F 1/203* (2013.01); *F28D 15/00* (2013.01); *F28F 3/12* (2013.01); *F28F 21/067* (2013.01); *F28F 2230/00* (2013.01); *F28F 2255/02* (2013.01)

(58) Field of Classification Search
USPC .......................................................... 165/46
See application file for complete search history.

(56) References Cited

U.S. PATENT DOCUMENTS

| | | | |
|---|---|---|---|
| 5,866,257 A | 2/1999 | Schledjewski et al. | |
| 6,062,299 A * | 5/2000 | Choo | F28D 15/00 165/104.21 |
| 6,690,578 B2 * | 2/2004 | Edelmann | H05K 7/20454 165/46 |
| 7,055,575 B2 * | 6/2006 | Noel | A61F 7/02 165/10 |
| 7,063,127 B2 * | 6/2006 | Gelorme | H01L 23/433 165/185 |
| 7,312,987 B1 * | 12/2007 | Konshak | G06F 1/20 165/80.4 |
| 7,709,951 B2 * | 5/2010 | Brodsky | H01L 23/42 257/675 |
| 7,952,873 B2 * | 5/2011 | Glahn | H05K 7/1404 165/104.33 |
| 7,995,344 B2 * | 8/2011 | Dando, III | H05K 7/20454 165/104.33 |
| 8,215,377 B1 * | 7/2012 | Monson | F28D 15/02 165/104.21 |
| 8,448,693 B2 * | 5/2013 | Lundell | F28F 13/00 165/185 |
| 8,891,235 B2 * | 11/2014 | Walczyk | F28F 9/007 165/80.3 |
| 9,546,827 B2 * | 1/2017 | Ludwig | F28F 1/00 |
| 9,615,486 B2 * | 4/2017 | De Bock | H01L 23/42 |
| 2002/0070445 A1 * | 6/2002 | Tarter | H01L 23/4275 257/714 |
| 2002/0088605 A1 * | 7/2002 | Malhammar | H01L 23/433 165/46 |
| 2004/0040082 A1 * | 3/2004 | Fireman | E04H 4/0025 4/506 |
| 2004/0074630 A1 * | 4/2004 | Sen | H01L 23/433 165/46 |
| 2004/0104021 A1 * | 6/2004 | Kujirai | F28F 3/02 165/185 |
| 2004/0190255 A1 * | 9/2004 | Cheon | G06F 1/20 361/699 |
| 2005/0039879 A1 * | 2/2005 | Hanai | H01L 23/367 165/46 |
| 2005/0039884 A1 * | 2/2005 | Pawlenko | F28F 3/02 165/80.4 |
| 2006/0151153 A1 | 7/2006 | Chen | |
| 2007/0218284 A1 * | 9/2007 | Wu | C25D 3/38 428/408 |
| 2008/0296757 A1 * | 12/2008 | Hoffman | H01L 23/42 257/713 |
| 2011/0039738 A1 | 2/2011 | Nakayoshi et al. | |
| 2013/0123887 A1 | 5/2013 | Iwanami et al. | |

FOREIGN PATENT DOCUMENTS

| | | |
|---|---|---|
| CN | 1877241 A | 12/2006 |
| CN | 2882205 Y | 3/2007 |
| CN | 101772290 A | 7/2010 |
| CN | 201600639 U | 10/2010 |
| JP | 08-064731 A | 3/1996 |
| JP | 10-146930 A | 6/1998 |
| JP | 2002-111258 A | 4/2002 |
| JP | 2002-138205 A | 5/2002 |
| JP | 2003-068952 A | 3/2003 |
| JP | 2004-179271 A | 6/2004 |
| JP | 2007-039621 A | 2/2007 |
| JP | 2009-179714 A | 8/2009 |
| JP | 2010-257236 A | 11/2010 |
| JP | 2012-009498 A | 1/2012 |
| JP | 2013-126523 A | 6/2013 |

OTHER PUBLICATIONS

International Search Report for PCT Patent App. No. PCT/JP2014/074798 dated (Oct. 14, 2014) with English language translation thereof.

Office Action from China Patent App. No. 201480059137.2 dated (May 22, 2017).

Office Action for Japanese Patent App. No. 2015-544862 dated (Jul. 3, 2018).

* cited by examiner

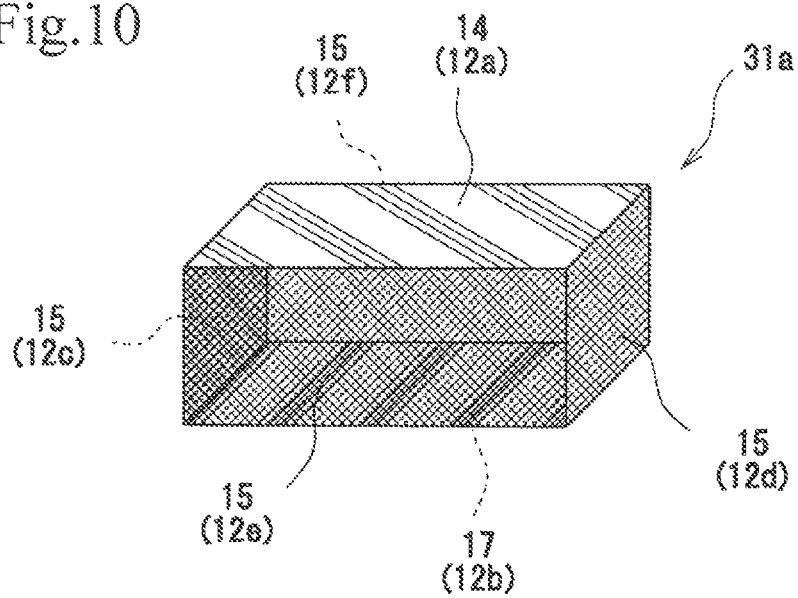
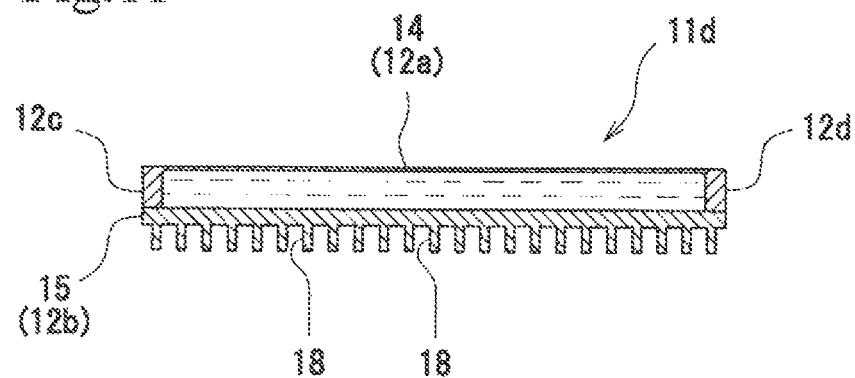
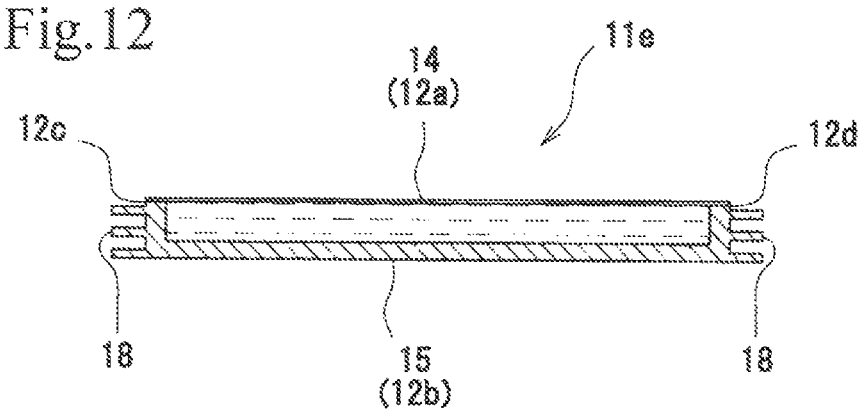

LIQUID-ENCAPSULATION HEAT DISSIPATION MEMBER

This application is a national phase entry under 35 U.S.C. § 371 of PCT Patent Application No. PCT/JP2014/074798, filed Sep. 19, 2014, which claims priority under 35 U.S.C. § 119 to Japanese Patent Application No. 2013-224051, filed Oct. 29, 2013, both of which are incorporated by reference.

TECHNICAL FIELD

The present invention relates to a liquid-encapsulation heat dissipation member for efficiently dissipating heat generated from an electronic device. In particular, the present invention relates to a liquid-encapsulation heat dissipation member, to which even a small electronic device placed thereon can dissipate heat.

BACKGROUND ART

In electronic devices, e.g., notebook personal computers, the amount of heat generated from internal components has increased in accordance with improvements in the performance of the devices. In the case where such an electronic device is used, when the outside air temperature is high or the condition of the installation location of the device is bad, the heat is not dissipated sufficiently and the operation of the device may become unstable. Japanese Unexamined Patent Application Publication No. 2004-179271 (PTL 1) discloses a cooling mat, in which an endothermic agent is encapsulated in a flat bag of resin film, aluminum foil, or the like, for the purpose of cooling such an electronic device. The operation of the electronic device, e.g., a personal computer, can be stabilized by laying this cooling mat under the electronic device. Also, Japanese Unexamined Patent Application Publication No. 2002-138205 (PTL 2) describes a single-plate-like, flexible, thermally conductive sheet used for heat dissipation.

CITATION LIST

Patent Literature

PTL 1: Japanese Unexamined Patent Application Publication No. 2004-179271
PTL 2: Japanese Unexamined Patent Application Publication No. 2002-138205

SUMMARY OF INVENTION

Technical Problem

In the invention described in Japanese Unexamined Patent Application Publication No. 2004-179271 (PTL 1), the bag is formed by laminating synthetic resin films on both the front and back surfaces of the resin film or the aluminum foil and, therefore, there is a disadvantage that flexibility is poor although bendability is exhibited. In this regard, a relatively heavy electronic device, e.g., a notebook personal computer, can adhere to the cooling mat by only placing the electronic device on the cooling mat. However, in recent years, the amount of heat generation of even a small electronic device has increased. Meanwhile, the weight of the device has been reduced. Therefore, when the electronic device is merely placed, the cooling mat of the related art is not sufficiently deformed to follow the outside shape of the electronic device, and, as a result, heat dissipation may become insufficient. In addition, this cooling mat has a problem that the endothermic agent is encapsulated in the bag, the heat dissipation efficiency is reduced after absorption of a predetermined amount of heat based on the heat capacity, and the temperature rises with long-term use.

Meanwhile, the flexible, thermally conductive sheet described in Japanese Unexamined Patent Application Publication No. 2002-138205 (PTL 2) has a disadvantage that the strength is low and the sheet is torn easily because a large amount of thermally conductive powder is mixed in a gel serving as a binder. Consequently, in the use where the electronic device is placed repeatedly, it is difficult to use because of being damaged easily. Also, a heat sink has to be disposed on the surface opposite to a heating element and usage patterns are limitative.

Accordingly, the present invention was made to solve the above-described problems. That is, an object is to provide a liquid-encapsulation heat dissipation member having durability so as not to be damaged by repetitive placement of a small electronic device, flexibility so as to follow the outside surface of even a small electronic device placed thereon, and a high cooling efficiency.

Solution to Problem

In order to achieve the above-described object, the present invention provides a liquid-encapsulation heat dissipation member, which is prepared by encapsulating a thermally conductive fluid in a closed container and which dissipates the heat generated from an electronic device placed on the closed container, wherein the closed container includes an elastic portion composed of an elastomer serving as a surface to come into contact with the electronic device and a heat dissipation portion composed of a hard material for dissipating the heat transferred from the electronic device, and the thermally conductive fluid contains a thermally conductive powder and has a viscosity of 200,000 mPa·s to 3,000,000 mPa·s.

The elastic portion is composed of an elastomer and there is no need to include a large amount of thermally conductive powder, and, as a result, excellent durability is exhibited. In addition, the elastic portion is easily deformed so as to follow the surface (outside surface) shape of the electronic device in contact with the elastic portion. Also, the viscosity of the thermally conductive fluid encapsulated in the closed container is 200,000 mPa·s to 3,000,000 mPa·s and, therefore, the thermally conductive powder mixed into the thermally conductive fluid can be fluidized promptly. Consequently, when the electronic device is placed on the liquid-encapsulation heat dissipation member, the flexible elastic portion is easily deformed along the outside surface of the electronic device and, in association that, the internal thermally conductive fluid is deformed and is moved. Then, the heat is transferred to the heat dissipation portion and the heat can be dissipated to the outside.

It is possible that part of the heat dissipation portion is composed of a material different from the material for the remainder of the heat dissipation portion and a difference in the degree of heat dissipation between the part of the heat dissipation portion and the remainder is provided. That is, a material having a thermal conductivity higher than the thermal conductivity of a material for the remainder is used for the part of the heat dissipation portion and, thereby, the heat can be dissipated from the part of the heat dissipation portion effectively. Also, the heat dissipation from the remainder can be suppressed.

The heat dissipation portion can be composed of a metal material having one surface in contact with the thermally conductive fluid and the other surface exposed to the outside. In the case where the heat dissipation portion composed of a metal material having one surface in contact with the thermally conductive fluid and the other surface exposed to the outside is disposed, the heat can be dissipated efficiently through the above-described heat dissipation portion. Consequently, the cooling performance of the liquid-encapsulation heat dissipation member can be enhanced.

In the liquid-encapsulation heat dissipation member, the closed container can include a heat dissipation elastic portion composed of a thin elastomer serving as a surface to come into contact with a member, which is a target of heat dissipation, and following the shape of the member. In the case where the closed container includes a heat dissipation elastic portion composed of a thin elastomer serving as a surface to come into contact with a member, which is a target of heat dissipation, and following the shape of the member, the liquid-encapsulation heat dissipation member can adhere to the surface of the target member, on which the liquid-encapsulation heat dissipation member is placed, and heat dissipation to the heat dissipation target member can be performed smoothly.

Advantageous Effects of Invention

The liquid-encapsulation heat dissipation member according to the present invention is a liquid-encapsulation heat dissipation member having durability so as not to be damaged by contact such as repetitive placement of an electronic device, flexibility so as to follow the outside surface of even a small electronic device placed thereon, and a high cooling efficiency.

BRIEF DESCRIPTION OF DRAWINGS

FIG. 10 is a schematic diagram of a liquid-encapsulation heat dissipation member according to a third embodiment.

FIG. 11 is a sectional view of a liquid-encapsulation heat dissipation member according to a common modified example.

FIG. 12 is a sectional view of a liquid-encapsulation heat dissipation member according to another common modified example.

DESCRIPTION OF EMBODIMENTS

Figure 1:
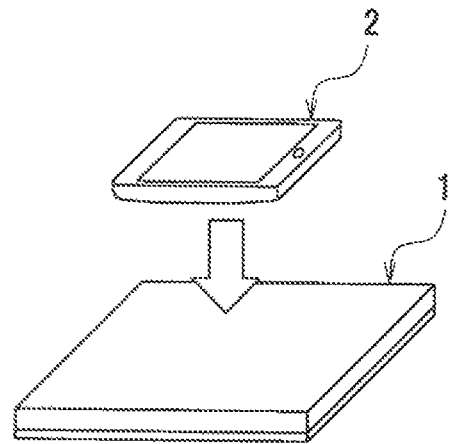
FIG. 1 is a perspective view illustrating the state of placing an electronic device on a liquid-encapsulation heat dissipation member.
Figure 2:
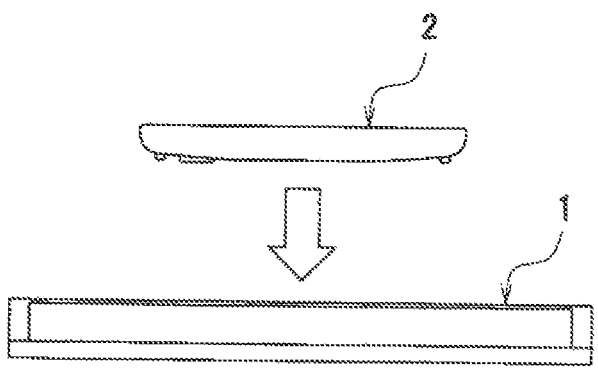
FIG. 2 is a side view of the state shown in FIG. 1.
Figure 3:
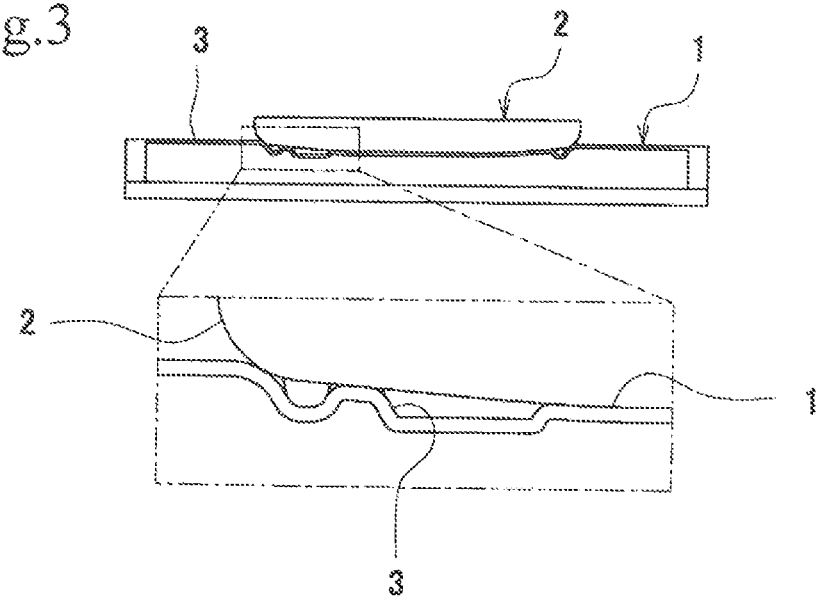
FIG. 3 is a side view illustrating the state in which an electronic device is placed on a liquid-encapsulation heat dissipation member.

The present invention will be described in detail with reference to the embodiments. The configurations common to the following embodiments are indicated by the same reference numerals and explanations thereof will not be duplicated. Also, explanations of common materials, manufacturing methods, operations and advantages, and the like will not be duplicated. A liquid-encapsulation heat dissipation member 1 according to the present invention dissipates the heat generated from a small electronic device 2 when the electronic device 2 is placed thereon, as shown in FIG. 1 and FIG. 2, and the surface 3 is made to bend along the shape of the electronic device 2 so as to ensure adhesion, as shown in FIG. 3.

Figure 4:
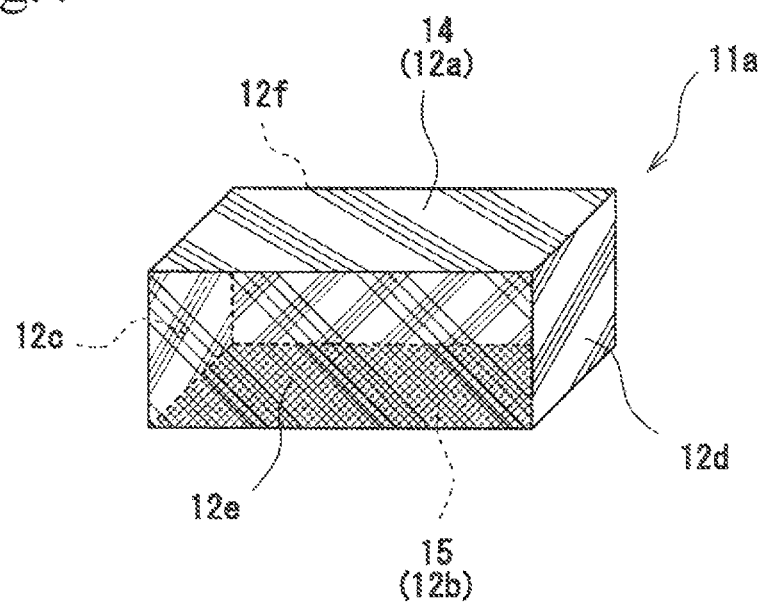
FIG. 4 is a schematic diagram of a liquid-encapsulation heat dissipation member according to a first embodiment.

First Embodiment [FIG. 4]:

A liquid-encapsulation heat dissipation member 11a according to the present embodiment includes a closed container 12 and a thermally conductive fluid 13 encapsulated into the closed container 12. As shown in the schematic diagram of FIG. 4, the closed container 12 is formed into a substantially rectangular parallelepiped shape having a top surface 12a, a bottom surface 12b, and four side surfaces 12c, 12d, 12e, and 12f.

The top surface 12a of the closed container 12 is an elastic portion 14 serving as a surface, which comes into contact with an electronic device when the electronic device is placed thereon, and is composed of a thin elastomer. The bottom surface 12b is a heat dissipation portion 15 for dissipating the heat transferred from the electronic device and is composed of a hard material. The inside surface of the heat dissipation portion 15 is in contact with the thermally conductive fluid 13, and the outside surface is exposed to the outside. The four side surfaces 12c, 12d, 12e, and 12f are composed of the elastomer continued from the top surface 12a and are formed having a large thickness such that the four side surfaces are not deformed so as to maintain the rectangular parallelepiped shape of the closed container 12 in the case where the electronic device placed on the elastic portion 14 is light and are deformed in the case where the electronic device is large and heavy. These portions will be described below in detail.

The thermally conductive fluid 13 encapsulated into the closed container 12 is a member for transferring the heat, which is released from the electronic device and which is transferred through the elastic portion 14, to the heat dissipation portion 15 and has an influence on the flexibility of the liquid-encapsulation heat dissipation member 11a because deformation of the elastic portion 14 is facilitated by fluidization in the closed container 12. A mixture of an oil and a thermally conductive powder can be used as the thermally conductive fluid 13. Examples of the oil include a mineral oil, a hydrocarbon base oil, an ester base oil, an ether base oil, a phosphoric acid ester base oil, a silicone oil, and a fluorine oil. Among them, a silicone oil is preferable because high heat resistance is exhibited, degradation due to an extended period of use does not occur easily, and inertness toward the elastic portion and the heat dissipation portion is exhibited so as not to affect them.

Examples of the thermally conductive powder include metal oxides, metal nitrides, metal carbides, various types of carbon, and metals. Specific examples include zinc oxide, aluminum oxide, titanium oxide, magnesium oxide, silicon oxide, aluminum nitride, boron nitride, silicon nitride, silicon carbide, graphite, diamond, aluminum, silver, and copper. Preferably, 95 to 45 percent by weight of thermally conductive powder is contained in the thermally conductive fluid. If the content is less than 45 percent by weight, sufficient thermal conductivity is not obtained, and if the content is more than 95 percent by weight, the viscosity of the thermally conductive fluid 13 increases excessively.

The average particle diameter of the thermally conductive powder is preferably 20 μm or less and more preferably 5 μm or less. If the average particle diameter is more than 20 μm, the compressibility of the thermally conductive fluid 13 is degraded and deformation of the elastic portion 14 may be restricted.

The viscosity of the thermally conductive fluid 13 may be 200,000 mPa·s to 3,000,000 mPa·s, preferably 420,000 mPa·s to 2,010,000 mPa·s, and more preferably 830,000 mPa·s to 1,360,000 mPa·s. If the viscosity is less than 200,000 mPa·s, the amount of filling of the thermally conductive powder is small, and, as a result, the thermal conductivity is low and the cooling performance may be degraded. On the other hand, if the viscosity is more than 3,000,000 mPa·s, the fluidity is poor, and, as a result, hardness increases and adhesion of the electronic device to the liquid-encapsulation heat dissipation member 11a may become difficult. Meanwhile, the viscosity is preferably 420,000 mPa·s or more because, in particular, the thermal conductivity increases easily, and if the viscosity is 2,010,000 mPa·s or less, in particular, adhesion to the electronic device is facilitated and the cooling performance can be enhanced. Further, if the viscosity is 830,000 mPa·s or more, precipitation of the thermally conductive powder can be suppressed. If the viscosity is 1,360,000 mPa·s or less, a high degree of balance between the following ability and the thermal conductivity can be ensured.

The thermal conductivity of the thermally conductive fluid 13 is preferably 0.5 W/mK or more. This is because if the thermal conductivity is less than 0.5 W/mK, the heat is not transferred to the heat dissipation portion 15 of the closed container 12 easily. Meanwhile, the upper limit of the thermal conductivity is not particularly specified, although it is substantially difficult to obtain a characteristic of 20 W/mK or more in the case of the thermally conductive fluid 13, which is made to have fluidity by dispersing a thermally conductive powder into an oil.

The thermally conductive fluid 13 may contain various additives, e.g., a dispersing agent, an antioxidant, and a flame retardant, as necessary, in addition to the thermally conductive powder.

Examples of situations, in which such a liquid-encapsulation heat dissipation member 11a is used, include acceleration of heat dissipation from an electronic device during charging. In recent years, electronic devices compatible with noncontact charging have become widespread and, therefore, a configuration compatible with this system is preferable. In the case of application for this use, it is preferable that a thermally conductive powder, which does not block the electromagnetic wave used in the noncontact charging and which does not reduce the charging efficiency, be used.

More specifically, the thermally conductive fluid 13 needs to exhibit no electrical conductivity. The electromagnetic wave is not blocked as long as the thermally conductive powder exhibiting electrical conductivity is not contained substantially. In this regard, even an electrically thermally conductive powder does not reduce the charging efficiency easily if an insulating coating is formed on the surface. For this reason, it is preferable that a thermally conductive powder exhibiting no electrical conductivity be used. Also, in the case where a soft magnetic material is contained in the thermally conductive powder, the magnetic permeability of the thermally conductive fluid is enhanced and the electromagnetic wave can be transmitted to the electronic device efficiently. Therefore, in order to increase the charging efficiency, it is preferable that the soft magnetic material be contained.

The heat dissipation portion 15 constituting the closed container 12 is composed of a hard material. Examples of the hard material include rigid bodies having high thermal conductivity, e.g., hard resins, metals, metal oxides, metal nitrides, metal carbides, graphitized materials, and composites thereof. Among them, from the viewpoint of workability, it is preferable to use hard resins. However, from the viewpoint of cooling performance, it is preferable to use metals, metal oxides, metal nitrides, metal carbides, and graphitized materials. Resins harder than the elastic portion can be used as the hard resins. Resins having a D hardness specified in JIS K6253 of D60 or more are more preferable. Specifically, polypropylenes, polycarbonates, and polyethylene terephthalates are suitable from the viewpoint of workability and ease of integration with an elastic member. Among metals, stainless steel, aluminum, and the like are preferable because their thermal conductivity is high and their corrosion resistance is excellent, and because of ease of availability. In particular, in the case where enhancement of the cooling performance is desired, copper having high thermal conductivity is preferable. The thermal conductivity is preferably 15 W/mK or more.

The elastic portion 14 is composed of a flexible rubber or an elastomer, and is composed of a material, which can bend so as to follow the outside shape of an electronic device placed thereon and which can adhere to the electronic device. In particular, even when the electronic device has unevenness, it is preferable to adhere to the electronic device so as to follow the unevenness. Also, it is preferable that the material not be damaged easily by repetitive use. Examples of the material for the elastic portion 14 having such functions include cross-linked rubber, e.g., natural rubber, acrylic rubber, butadiene rubber, isoprene rubber, styrene-butadiene copolymer rubber, nitrile rubber, hydrogenated nitrile rubber, chloroprene rubber, ethylene-propylene copolymer rubber, chlorinated polyethylene rubber, chlorosulfonated polyethylene rubber, butyl rubber, halogenated butyl rubber, fluororubber, urethane rubber, and silicone rubber, styrene-butadiene block copolymers and hydrogenated polymers thereof, styrene-isoprene block copolymers and hydrogenated polymers thereof, thermoplastic elastomers, e.g., styrene thermoplastic elastomers, olefinic thermoplastic elastomers, vinyl chloride thermoplastic elastomers, polyester thermoplastic elastomers, polyurethane thermoplastic elastomers, and polyamide thermoplastic elastomers. Among them, silicone rubber is preferable from the viewpoints of heat resistance and weatherability. Also, polyurethane resins are preferable from the viewpoints of durability and flexibility.

Also, the elastic portion 14 has flexibility and can follow the outside shape of the electronic device. Therefore, the elastic portion 14 needs to have extensibility to some extent and the hardness is preferably A30 to A60 on an A hardness scale specified in JIS K6253. If the hardness is less than A30, the strength may be reduced and the durability may be degraded. On the other hand, if the hardness is more than A60, the elastic portion 14 becomes too hard and adhesiveness to the electronic device may be degraded.

It is preferable that the thermal conductivity of the elastic portion 14 be higher, and the durability be higher because the electronic device is repeatedly placed thereon. It is considered that a thermally conductive powder be mixed into the elastic portion 14 from the viewpoint of enhancing the thermal conductivity. However, if a large amount is mixed, the durability is degraded. Therefore, the amount of mixing of the thermally conductive powder, if any, is reduced to a small amount. Consequently, the thermal conductivity of the elastic portion 14 tends to become smaller than the thermal conductivity of the thermally conductive fluid 13, and as the thickness of the elastic portion 14 increases, the thermal conductivity is reduced. Then, it is preferable that a material having high durability be used for the elastic portion 14 and the thickness be decreased so as to ensure a balance between the durability and the thermal conductivity. In this regard, in the case where the thermally conductive powder is mixed, the same thermally conductive powder as that contained in the thermally conductive fluid may be used and the amount of mixing is specified as less than 45 percent by weight and more preferably 20 percent by weight or less. For example, titanium oxide serving as a thermally conductive powder can also be used as an additive for coloring. In that case, the amount of mixing is about 5 to 15 percent by weight and the durability is hardly degraded.

The thickness of the elastic portion 14 is specified as preferably 0.1 mm to 5.0 mm and more preferably 0.5 mm to 2.0 mm. If the thickness is less than 0.1 mm, the thickness is too small and the durability may become insufficient. If the thickness is more than 5.0 mm, heat transfer from the electronic device that generates heat to the thermally conductive fluid 13 may be hindered.

In this regard, the thickness of the elastic portion 14 is not necessarily made uniform. In the case where the thickness of at least the portion opposite to the heat generation portion of the electronic device is specified to be within the above-described range, the thickness of the other portion may be increased. This is because even when the thickness of the portion other than the portion in contact with the electronic device is larger than the above-described upper limit of the thickness, the thermal conductivity is hardly affected. However, it is preferable that a region broader than the outside shape of the electronic device have the above-described predetermined thickness. This is because, from the viewpoint of flexibility, in the case where the region broader than the outside shape of the electronic device has the above-described predetermined thickness, the flexibility of the entire elastic portion 14 can be enhanced.

The elastic portion 14 may be configured to include a mesh-like member. In a specific example, a mesh-like resin film is buried in the wall of the elastic portion 14. In the case where the mesh-like member is included, the dimensional stability can be enhanced. In addition, although the elastic portion 14 may swell depending on the type of oil of the thermally conductive fluid 13, the swelling can be suppressed. Examples of the mesh-like member include a resin mesh having high bendability. In particular, the dimensional stability can be enhanced without degrading the following ability by using a polyester mesh or a nylon mesh.

In this regard, the closed container 12 may include constituents other than the elastic portion 14 and the heat dissipation portion 15. Regarding the liquid-encapsulation heat dissipation member 11a, side walls 12c, 12d, 12e, and 12f composed of an elastomer correspond to such constituents. In addition, an attachment portion for placing the liquid-encapsulation heat dissipation member 11a, a fixing portion for fixing the electronic device to the liquid-encapsulation heat dissipation member 11a, and the like can be disposed.

The liquid-encapsulation heat dissipation member 11a is produced by forming the top surface 12a and the four side surfaces 12c, 12d, 12e, and 12f from an elastomer so as to form the closed container 12 without the bottom surface 12b, putting the thermally conductive fluid 13 into this and, thereafter, sealing the top surface 12a of the closed container 12 with a metal sheet or a hard resin sheet by using an adhesive tape or the like. The liquid-encapsulation heat dissipation member 11a is produced as described above.

The elastomer serving as the elastic portion 14 and the side surfaces 12c, 12d, 12e, and 12f may be produced by solidifying an uncured liquid resin in a frame or fixing plate-like or film-like materials prepared in advance.

At the border between an area composed of the elastomer and an area composed of the hard material, a thin-walled portion extending from the end portion of the elastomer may be provided on the back or front surface of the hard material so as to enhance the fixability between the two areas and reduce risks of, for example, leakage of the thermally conductive fluid 13 due to peeling of the two areas from each other. However, if the thin-walled portion is too widely provided, influence on the heat transfer increases. Therefore, care is needed from the viewpoint of cooling performance. Specific examples of the form of provision of the thin-walled portion include a form in which a thin-walled portion is provided in the vicinity of the outer edge of the plate-like heat dissipation portion 15 and the heat dissipation portion 15 is exposed at the center.

According to the liquid-encapsulation heat dissipation member 11a, when the electronic device is placed on the elastic portion 14, the elastic portion 14 is bent along the outside shape of the electronic device, and the elastic portion 14 can adhere to the electronic device. Then, the heat generated from the electronic device is transferred through the thin elastic portion 14 to the thermally conductive fluid 13 and to the heat dissipation portion 15 so as to be released to the outside. Therefore, the cooling efficiency is high. The elastic portion 14 is not damaged by contact such as repetitive placement of the electronic device and has excellent durability.

Figure 5:
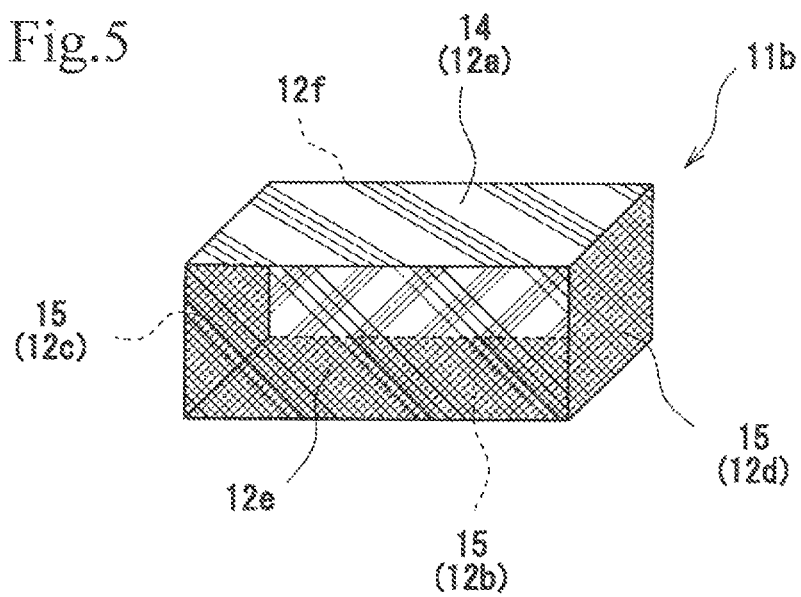
FIG. 5 is a schematic diagram of a liquid-encapsulation heat dissipation member according to a first modified example of the first embodiment.

Modified Example 1-1 [FIG. 5]:

FIG. 5 shows a liquid-encapsulation heat dissipation member 11b as a first modified example of the present embodiment. In the liquid-encapsulation heat dissipation member 11b, not only the bottom surface 12b but also a pair of side surfaces 12c and 12d opposite to each other are specified as the heat dissipation portion 15 composed of the hard material. The remainder pair of side surfaces 12e and 12f are composed of the elastomer continued from the top surface 12a as in the liquid-encapsulation heat dissipation member 11a. The liquid-encapsulation heat dissipation member 11b can enhance the cooling efficiency because heat dissipation can be facilitated by the two side surfaces 12c and 12d opposite to each other.

Figure 6:
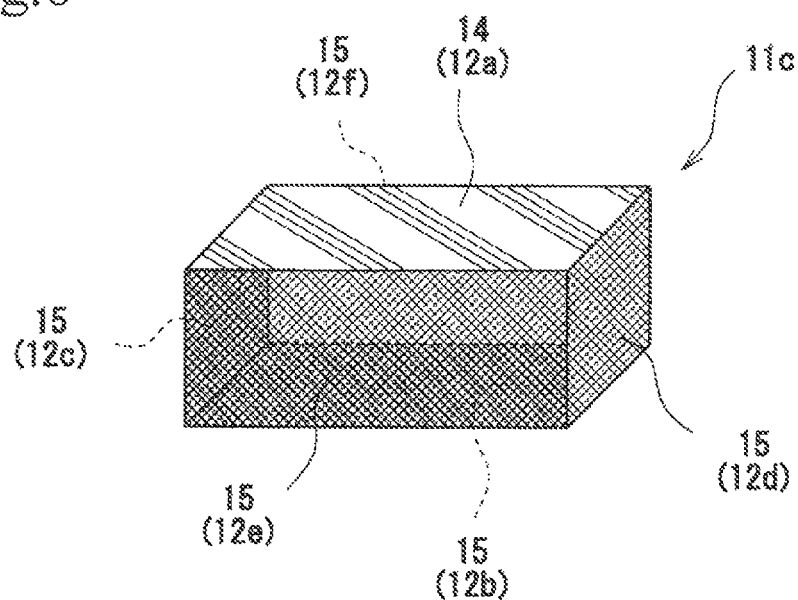
FIG. 6 is a schematic diagram of a liquid-encapsulation heat dissipation member according to a second modified example of the first embodiment.

Modified Example 1-2 [FIG. 6]:

FIG. 6 shows a liquid-encapsulation heat dissipation member 11c as a second modified example. In the liquid-encapsulation heat dissipation member 11c, the bottom surface 12b and all the four side surfaces 12c, 12d, 12e, and 12f of the closed container 12 are specified as the heat dissipation portion 15 composed of the hard material. In other words, the surfaces other than the top surface 12a serving as the elastic portion 14 are specified as the heat dissipation portion 15. In this configuration, the cooling efficiency can be further enhanced because heat dissipation can be facilitated by all the side surfaces 12c, 12d, 12e, and 12f of the closed container 12.

Figure 7:
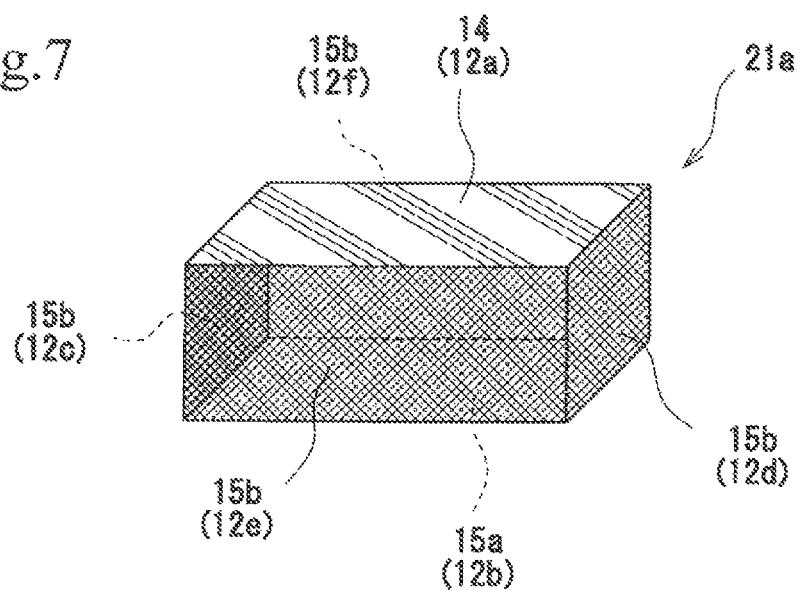
FIG. 7 is a schematic diagram of a liquid-encapsulation heat dissipation member according to a second embodiment.

Second Embodiment [FIG. 7]:

In a liquid-encapsulation heat dissipation member 21a according to the present embodiment, part of the heat dissipation portion 15 is formed from a material different from the material for the remainder, and, as a result, there is a difference in the degree of heat dissipation between the part of the heat dissipation portion 15 and the remainder, in contrast to the liquid-encapsulation heat dissipation member 11c and the like according to the first embodiment. In the liquid-encapsulation heat dissipation member 21a, the bottom surface 12b and all the four side surfaces 12c, 12d, 12e, and 12f are the heat dissipation portions 15 composed of hard materials. However, the bottom surface 12b of the closed container 12 is specified as a high heat dissipation portion 15a composed of a metal material and the four side surfaces 12c, 12d, 12e, and 12f are specified as a low heat dissipation portion 15b composed of a hard resin material.

In the liquid-encapsulation heat dissipation member 21a, heat dissipation from the bottom surface 12b composed of the metal having thermal conductivity higher than the thermal conductivity of the hard resin is made easy, and heat dissipation from the side surfaces 12c, 12d, 12e, and 12f is somewhat suppressed. Consequently, heat dissipation from the bottom surface 12b can be facilitated. It is possible that heat dissipation to the member, on which the liquid-encapsulation heat dissipation member 21a is placed, is facilitated and heat transfer to the components and the like, which are placed beside the liquid-encapsulation heat dissipation member 21a, is suppressed.

Figure 8:
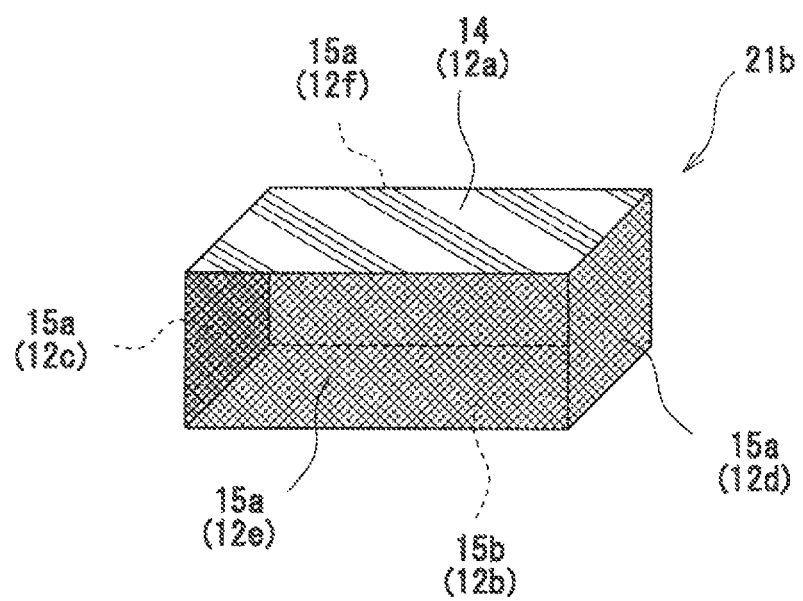
FIG. 8 is a schematic diagram of a liquid-encapsulation heat dissipation member according to a first modified example of the second embodiment.

Modified Example 2-1 [FIG. 8]:

FIG. 8 shows a liquid-encapsulation heat dissipation member 21b as a first modified example of the present embodiment. In the liquid-encapsulation heat dissipation member 21b, the bottom surface 12b of the closed container 12 is specified as a low heat dissipation portion 15b composed of the hard resin material and the four side surfaces 12c, 12d, 12e, and 12f are specified as a high heat dissipation portion 15a composed of the metal material, contrary to the liquid-encapsulation heat dissipation member 21a.

In the liquid-encapsulation heat dissipation member 21b, it is possible that heat dissipation from the bottom surface 12b composed of the hard resin having thermal conductivity lower than the thermal conductivity of the metal is suppressed and heat dissipation from the side surfaces 12c, 12d, 12e, and 12f is somewhat facilitated. This is suitable for the case where, for example, the liquid-encapsulation heat dissipation member 21b is placed on a member which should preferably not receive heat transferred.

Figure 9:
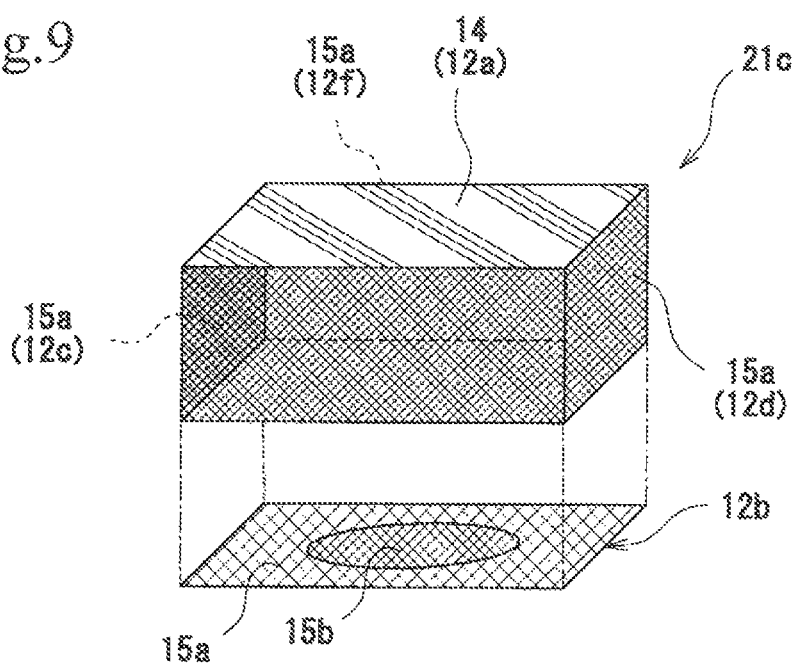
FIG. 9 is a schematic diagram of a liquid-encapsulation heat dissipation member according to a second modified example of the second embodiment.

Modified Example 2-2 [FIG. 9]:

FIG. 9 shows a liquid-encapsulation heat dissipation member 21c as a second modified example of the present embodiment. In the liquid-encapsulation heat dissipation member 21c, the center circle portion of the bottom surface 12b of the closed container 12 is composed of the hard resin and the periphery thereof is composed of the metal material. That is, a low heat dissipation portion 15b composed of the hard resin material and a high heat dissipation portion 15a composed of the metal material are disposed as the bottom surface 12b. In this regard, in FIG. 9, only the bottom surface 12b is separately shown in the drawing for the sake of understanding the structure of the bottom surface 12b.

In the case where the liquid-encapsulation heat dissipation member is used for an electronic device, which is subjected to noncontact charging, it is necessary to avoid the liquid-encapsulation heat dissipation member from blocking electromagnetic waves. Therefore, it is preferable that the heat dissipation portion 15 composed of an insulating hard resin rather than the heat dissipation portion 15 composed of a metal be disposed as the bottom surface 12b. However, an electrically conductive heat dissipation portion 15 can be formed as long as overlapping with a coil of a noncontact charger is avoided, and the heat dissipation portion 15 can be produced by combining the hard resin material and the metal as in the present modified example. According to such a heat dissipation portion 15, a metal material can be provided as the bottom surface 12b while blocking of electromagnetic waves is avoided, and high cooling performance can be maintained.

Third Embodiment [FIG. 10]:

A liquid-encapsulation heat dissipation member 31 according to the present embodiment includes the closed container 12 provided with a heat dissipation elastic portion 17 composed of a thin elastomer serving as a surface to come into contact with a member, which is a target of heat dissipation, and following the shape of the member, in contrast to the liquid-encapsulation heat dissipation member 11 according to the first embodiment. As shown in FIG. 10, in the liquid-encapsulation heat dissipation member 31a, not only the top surface 12a of the closed container 12 but also the bottom surface 12b is composed of the elastomer, where the material and the thickness are the same as those of the top surface 12a, and the bottom surface 12b is specified as the heat dissipation elastic portion 17. The entirety of the four side surfaces 12c, 12d, 12e, and 12f is specified as the heat dissipation portion 15.

In the liquid-encapsulation heat dissipation member 31a, the bottom surface 12b of the closed container 12 is composed of the thin elastomer which follows the outside shape of a member, on which the bottom surface 12b is placed. Therefore, if the member has unevenness on the surface, the heat dissipation elastic portion 17 follows the unevenness and, thereby, heat can be dissipated efficiently. Also, in the case where a liquid-encapsulation heat dissipation member 11d is disposed on a metal rack, the adhesiveness to the rack is enhanced, the heat is released easily, and the cooling performance can be enhanced. The thickness of the heat dissipation elastic portion 17 is specified as preferably 0.1 mm to 5.0 mm and more preferably 0.5 mm to 2.0 mm as with the elastic portion. If the thickness is less than 0.1 mm, the durability may become insufficient because the thickness is too small. If the thickness is more than 5.0 mm, heat transfer from the electronic device that generates heat to the thermally conductive fluid 13 may be hindered.

Modified Example Common to Each Embodiment [FIGS. 11 and 12]:

The surface shape of the heat dissipation portion 15 is not only flat and may be configured to have protrusions 18 in the shape of a column, plate, or the like. For example, in the liquid-encapsulation heat dissipation member 11d shown in FIG. 11, protrusions 18 are provided on the heat dissipation portion 15 so as to increase a surface area of the heat dissipation portion 15 and, thereby, the cooling performance is enhanced. A liquid-encapsulation heat dissipation member 11e shown in FIG. 12 is an example in which protrusions 18 are provided on the heat dissipation portion 15 disposed as the side surfaces 12c and 12d.

The examples explained in the above-described embodiments are no more than examples, and the shape, the material, the manufacturing method, and the like of the closed container can be modified appropriately. For example, use of known raw materials other than those described above and combinations of configurations shown in the individual embodiments can be performed appropriately within the bounds of not departing from the gist of the present invention, and these modifications are included in the technical ideas of the present invention. For example, the shape of the closed container 12 has been explained as a substantially rectangular parallelepiped shape, although the shape is not limited to this. Also, the material of the heat dissipation portion 15 may be a combination of at least two types.

EXAMPLES

The present invention will be described below with reference to specific examples.

Sample 1

A liquid-encapsulation heat dissipation member serving as Sample 1, which was a rectangular parallelepiped closed container, as shown in FIG. 4, was produced. The top surface and the side surfaces were composed of an elastomer, and the bottom surface was composed of an aluminum plate. The outer shape of Sample 1 was 110 mm×75 mm×5.6 mm, and the thickness of the inside of the closed container without deformation (thickness of thermally conductive fluid portion) was 4.0 mm.

The bottom surface was the aluminum plate having a thickness of 1 mm. The top surface was an elastic portion and was composed of silicone rubber having a thickness of 0.6 mm and a hardness of A50. The side surfaces were composed of the silicone rubber continued from the top surface, the thickness was 5.0 mm, and the height was 4.6 mm. In this regard, a polyester mesh (line diameter of 0.1 mm, density of 40 lines/inch, plain weave, heat-fused) was buried in the silicone rubber of the top surface. The thermally conductive fluid was produced by mixing 740 parts by weight of aluminum oxide (crushed, particle diameter of 70 μm) and 450 parts by weight of aluminum oxide (crushed, particle diameter of 4 μm) into 100 parts by weight of silicone oil. The thermal conductivity of the thermally conductive fluid was 2.44 W/m·K and the viscosity was 1,360,000 mPa·s. [Formulation 3]

Sample 2

A liquid-encapsulation heat dissipation member serving as Sample 2, which was a rectangular parallelepiped closed container, as shown in FIG. 5, was produced. A pair of side surfaces were composed of an elastomer, and the remainder pair of side surfaces were specified as a heat dissipation portion composed of an aluminum plate. The thicknesses of the surfaces composed of the elastomer and the side surfaces composed of the aluminum plate were 5 mm. Sample 2 was the same as Sample 1 except those described above.

Sample 3

A liquid-encapsulation heat dissipation member serving as Sample 3, which was a rectangular parallelepiped closed container, as shown in FIG. 6, was produced. All side surface were composed of an aluminum plate having a thickness of 5 mm and the bottom surface was composed of an aluminum plate having a thickness of 1 mm. Sample 3 was the same as Sample 1 except those described above.

Sample 4

Sample 4 had the shape shown in FIG. 8. All side surface were composed of an aluminum plate having a thickness of 5 mm and the bottom surface was composed of a polyethylene terephthalate film having a thickness of 50 μm. Sample 4 was the same as Sample 1 except those described above.

Sample 5

Sample 5 had an outside shape different from the outside shapes of the above-described samples and was produced as a heat dissipation member, in which aluminum plate was stacked on a simple heat dissipation sheet, without using a thermally conductive fluid.

The heat dissipation sheet was obtained by mixing 180 parts by weight of aluminum hydroxide (crushed, particle diameter of 50 μm) and 180 parts by weight of aluminum hydroxide (crushed, particle diameter of 8 μm) into 100 parts by weight of liquid silicone rubber and, thereafter, performing heat curing. The outer shape was 110 mm×75 mm×5.0 mm. In this regard, the thermal conductivity of the heat dissipation sheet was 2.0 W/m·K. The thickness of the aluminum plate was 1 mm.

Sample 6

In Sample 6, as with Sample 4, all side surfaces were composed of an aluminum plate having a thickness of 5 mm and the bottom surface was composed of a polyethylene terephthalate film having a thickness of 50 μm, although the elastic portion of the top surface was a polyethylene film (PE film) having a thickness of 0.1 mm. Sample 6 was the same as Sample 4 except that described above.

Sample 7

In Sample 7, as with Sample 4, all side surfaces were composed of an aluminum plate having a thickness of 5 mm and the bottom surface was composed of an aluminum plate having a thickness of 1 mm, although the elastic portion of the top surface was an urethane film having a thickness of 0.2 mm. Sample 7 was the same as Sample 4 except that described above.

Sample 8

Sample 8 was the same as Sample 4 except that the side surfaces were specified as a polycarbonate resin.

Sample 9 to Sample 15

Each of Sample 9 to Sample 15 was specified as the same closed container as Sample 4, although the thermally conductive fluid encapsulated was changed as described below. Each Sample was the same as Sample 4 except that described above.

The thermally conductive fluid of Sample 9 was produced by adding 650 parts by weight of aluminum oxide (crushed, particle diameter of 70 μm) and 400 parts by weight of aluminum oxide (crushed, particle diameter of 4 μm) to 100 parts by weight of silicone oil. The thermal conductivity was 2.21 W/m·K and the viscosity was 830,000 mPa·s. [Formulation 1]:

The thermally conductive fluid of Sample 10 was produced by adding 800 parts by weight of aluminum oxide (crushed, particle diameter of 70 μm) and 490 parts by weight of aluminum oxide (crushed, particle diameter of 4 μm) to 100 parts by weight of silicone oil. The thermal conductivity was 2.64 W/m·K and the viscosity was 2,010,000 mPa·s. [Formulation 4]

The thermally conductive fluid of Sample 11 was produced by adding 690 parts by weight of aluminum oxide (crushed, particle diameter of 70 μm) and 420 parts by weight of aluminum oxide (crushed, particle diameter of 4 μm) to 100 parts by weight of silicone oil. The thermal conductivity was 2.53 W/m·K and the viscosity was 870,000 mPa·s. [Formulation 2]

In Sample 12, only silicone oil was used in place of the thermally conductive fluid. The thermal conductivity was 0.16 W/m·K and the viscosity was 100,000 mPa·s. [Formulation 5]

The thermally conductive fluid of Sample 13 was produced by adding 636 parts by weight of aluminum oxide (crushed, particle diameter of 70 μm) and 162 parts by weight of aluminum oxide (crushed, particle diameter of 4 μm) to 100 parts by weight of silicone oil. The thermal conductivity was 2.73 W/m·K and the viscosity was 420,000 mPa·s. [Formulation 6]

The thermally conductive fluid of Sample 14 was produced by adding 545 parts by weight of aluminum oxide (crushed, particle diameter of 70 μm) and 364 parts by weight of aluminum oxide (crushed, particle diameter of 4 μm) to 100 parts by weight of silicone oil. The thermal conductivity was 1.63 W/m·K and the viscosity was 200,000 mPa·s. [Formulation 7]

The thermally conductive fluid of Sample 15 was produced by adding 568 parts by weight of aluminum oxide (crushed, particle diameter of 4 μm) to 100 parts by weight of silicone oil. The thermal conductivity was 1.31 W/m·K and the viscosity was 2,970,000 mPa·s. [Formulation 8]

Sample 16

Sample 16 was the same as Sample 4 except that the polyester mesh was not buried into the elastic portion.

Evaluation of Performance of Each Sample:

Each of the above-described samples was subjected to various tests described below and the performance was evaluated. In these tests, a tester 51 simulating an electronic device that generates heat was used.

Figure 13:
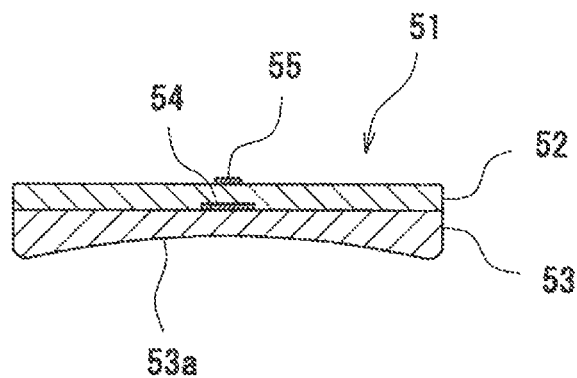
FIG. 13 is a sectional view of a tester simulating an electronic device.

The tester 51 has the shape shown in FIG. 13. Specifically, an upper case 52 and a lower case 53 composed of an acrylic resin are included. The outside shape is 70 mm×130 mm×5 mm. The surface of the lower case has a bent surface 83a with R=160 mm and the depth of a dent at the center portion is specified as about 2 mm relative to the end portion. In addition, a recess is disposed in the central portion separated into the upper case 52 and the lower case 53 and a heating element (heater) 54 having a calorific value of 45 W is buried therein. The remainder other than the recess is formed into a solid portion. Meanwhile, in the upper case 52, a thermocouple 55 is brought into contact with and is fixed to a portion, at which the temperature is the highest, at the center of the surface opposite to the above-described recess. In this regard, the bent surface 53a is specified as reverse R so as to generate a gap between the bottom surface and a sample in the case of the sample including an elastic portion exhibiting poor following ability.

(1) Durability Test:

The elastic portion of each sample was subjected to a tester placement/lifting operation 10 times and, thereafter, the surface state of the elastic portion was observed.

As a result, the case where no change was observed was rated as "◯", the case where a scratch was observed on the surface but heat transfer performance was not impaired was rated as "Δ", and the case where cracking or breakage occurred was rated as "x".

(2) Cooling Ability Test

Figure 14:
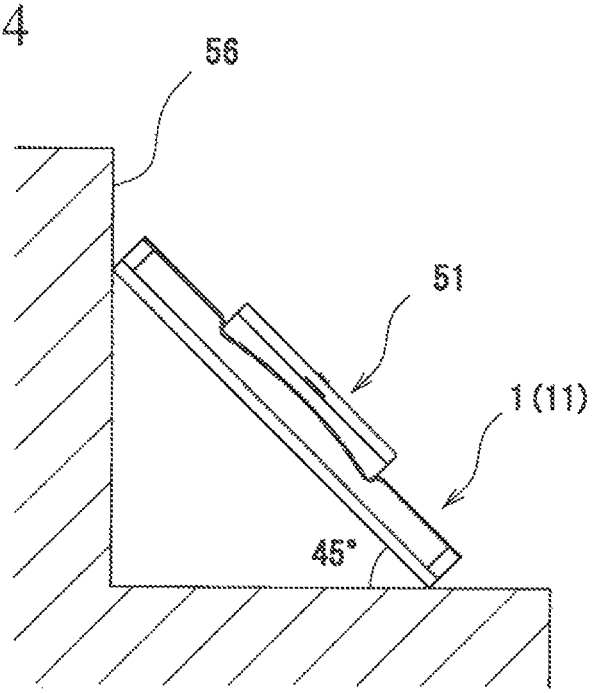
FIG. 14 is an explanatory diagram showing the arrangement of the tester in a cooling ability test.

As shown in FIG. 14, the above-described tester was placed on the top surface (elastic portion) of each sample, and the resulting sample was arranged so as to be leaned at an angle of 45° against the wall in a constant temperature bath. The temperature of the tester 120 minutes after placement of the tester on each sample was measured by a thermocouple, and a difference (° C.) from the ambient temperature (40° C.) in the constant temperature bath at that time was calculated. Then, in the case where the temperature difference from the ambient temperature was small, the cooling ability was rated as high, and in the case where the temperature difference from the ambient temperature was large, the cooling ability was rated as low.

For reference purposes, the tester without each sample was arranged so as to be leaned against the wall of the constant temperature bath, a temperature difference between the surface of the tester in the state, in which the outside surface of the tester was exposed to the air, and the measurement ambient temperature was calculated and was 12.1° C.

(3) Following Ability Test

When the tester was placed on the elastic portion, the degree of deformation (following ability) of the elastic portion along the surface shape of the tester was evaluated on the basis of the penetration.

It was considered that the following ability was influenced by the properties of the elastic portion and the thermally conductive fluid significantly. Therefore, a test was performed by using a proper jig described below.

The jig was composed of SUS and was in a rectangular parallelepiped shape having an outside shape of 80 mm×80 mm×11.6 mm and having a vertically penetrated cavity therein, where the cavity had openings with a diameter of 44 mm in the center of each of the top surface and the bottom surface. The opening of the bottom surface was blocked with a PET film, the thermally conductive fluid used in each of the above-described samples was put into the cavity, and the opening of the top surface was covered with the material used in each of the samples.

Subsequently, the penetration of the surface of the silicone rubber or the like covering the top surface was measured by using an apparatus described in JIS K2220. A needle having the shape specified in JIS K2207 was used and the weight of the entirety of the needle and a needle fixture (that is, the weight applied to the elastic portion of the silicone rubber or the like sealing the thermally conductive fluid) was specified as 50 g.

Evaluation Results of Each Sample:

The evaluation results of the above-described each test are shown in Table 1 below.

TABLE 1

| Sample No. | Outside shape of sample (substantially rectangular parallelepiped shape) | | | Corresponding drawing | Thermally conductive fluid | Evaluation | | | | |
|---|---|---|---|---|---|---|---|---|---|---|
| | Top surface | Bottom surface | Side surface | | | Durability | Cooling ability (number is temperature difference) | | Following ability (number is penetration) | |
| 1 | rubber | aluminum | rubber | FIG. 4 | Formulation 3 | ○ | ○ | 8.4 | ○ | 310 |
| 2 | rubber | aluminum | rubber + aluminum | FIG. 5 | Formulation 3 | ○ | ○ | 7.9 | — | — |
| 3 | rubber | aluminum | aluminum | FIG. 6 | Formulation 3 | ○ | ○ | 7.2 | — | — |
| 4 | rubber | PET | aluminum | FIG. 8 | Formulation 3 | ○ | ○ | 9.9 | — | — |
| 5 | — | — | — | — | — | X | X | 13.8 | ○ | 820 |
| 6 | PE | PET | aluminum | FIG. 8 | Formulation 3 | Δ | X | 12.4 | X | impossible |
| 7 | urethane | PET | aluminum | FIG. 8 | Formulation 3 | ○ | ○ | 9.7 | ○ | 205 |
| 8 | rubber | PET | PC | FIG. 8 | Formulation 3 | ○ | ○ | 10.9 | — | — |
| 9 | rubber | PET | aluminum | FIG. 8 | Formulation 1 | ○ | ○ | 11.2 | ○ | 296 |
| 10 | rubber | PET | aluminum | FIG. 8 | Formulation 4 | ○ | ○ | 9.3 | Δ | 210 |
| 11 | rubber | PET | aluminum | FIG. 8 | Formulation 2 | ○ | ○ | 9 | ○ | 246 |
| 12 | rubber | PET | aluminum | FIG. 8 | Formulation 5 | ○ | X | 13.1 | ○ | 355 |
| 13 | rubber | PET | aluminum | FIG. 8 | Formulation 6 | ○ | ○ | 8.7 | ○ | 318 |
| 14 | rubber | PET | aluminum | FIG. 8 | Formulation 7 | ○ | ○ | 11.5 | ○ | 337 |
| 15 | rubber | PET | aluminum | FIG. 8 | Formulation 8 | ○ | ○ | 11.9 | Δ | 191 |
| 16 | rubber (mesh X) | PET | aluminum | FIG. 8 | Formulation 3 | ○ | ○ | 9.1 | ⊙ | 370 |

In this regard, Sample 1 to Sample 16 were not subjected to the following ability test. However, the above-described following ability test was performed by using the same elastic portion and thermally conductive fluid as those used in Sample 1, and the result is shown in the column of Evaluation of Sample 1. The same goes for Sample 5 to Sample 7 and Sample 9 to Sample 16.

Consideration of Each Test Result:

(1) Durability

Regarding Sample 1 to Sample 4 and Sample 7 to Sample 16 in which the silicone rubber was used for the elastic portion, no change in the surface was observed between before and after the test. However, cracking occurred in the surface of Sample 5 in which the heat dissipation sheet was used. It is considered that the strength of Sample 5 was poor because of the material in which a large amount of filler was added to the silicone rubber. Meanwhile, a scratch was observed in the surface of Sample 6 in which polyethylene film was used as the surface to be brought into contact with the tester.

(2) Cooling Ability and Following Ability

As is clear from comparisons between Sample 1 to Sample 4 in which the heat dissipation portions were different from each other, Sample 3, in which the metal heat dissipation portion was disposed as all the side surfaces and the bottom surface, exhibited the lowest numerical value of the cooling ability and, therefore, had a high heat dissipation effect. Sample 4, in which PET was used as the bottom surface, exhibited the highest numerical value of the cooling ability and, therefore, had a low heat dissipation effect.

Also, as is clear from comparisons between Sample 4 and Sample 8, in which the bottom surfaces were a hard resin, Sample 4 provided with the metal heat dissipation portion as the side surfaces exhibited a cooling effect higher than the cooling effect of Sample 8 having side surfaces composed of the polycarbonate resin and, therefore, the cooling effect was able to be enhanced by providing the metal heat dissipation portion as the side surfaces. From these results, it is considered that the cooling performance is enhanced as the area of the heat dissipation portion increases.

As is clear from comparisons between Sample 1 and Sample 5, which had a commonality that a metal plate with the same size was included, Sample 5 configured not to have the thermally conductive fluid exhibited cooling performance lower than the cooling performance of Sample 1 configured to have the thermally conductive fluid.

According to comparisons between Sample 4, Sample 6, and Sample 7, which were different from each other in only the material for the upper surface (elastic portion), the cooling performance of Sample 6 including the PE film was very low. The reason for this is considered to be that the PE film had low ability to follow the tester and, therefore, did not adhere to the tester. Meanwhile, Sample 7 including the urethane film exhibited cooling performance lower than the cooling performance of Sample 3, although the result was better than the result of Sample 6. The thickness of the urethane film was 0.2 mm and was smaller than the thickness of the silicone rubber. Therefore, it is considered that the urethane film was advantageous from the viewpoint of thermal conductivity but was inferior to the silicone rubber in following ability because the hardness of the silicone rubber was A50 whereas the hardness of the urethane film was A60.

According to comparisons between Sample 4 and Sample 9 to Sample 12, which were different from each other in only the type of thermally conductive fluid, Sample 10, in which the formulation of the thermally conductive powder was changed so as to have high viscosity and high thermal conductivity, exhibited somewhat low following ability, although the cooling performance was high. It is considered that the thermal conductivity of the thermally conductive fluid was enhanced. Meanwhile, Sample 11 having somewhat low viscosity and high thermal conductivity compared with Sample 4 exhibited excellent cooling performance. On the other hand, Sample 9 having low viscosity and low thermal conductivity compared with Sample 4 exhibited excellent following ability, although the cooling performance was somewhat low. Meanwhile, Sample 12, in which a thermally conductive powder was not mixed, exhibited low viscosity and very low cooling performance.

Sample 16, in which no mesh was put into the elastomer of the top surface, exhibited slightly high cooling performance compared with Sample 4 including the mesh. It is considered that Sample 16 exhibited excellent following ability because no mesh was buried.

(3) Others

After the sample was produced, the sample was left stand for a week, and the state of the sample at that time was compared with the initial state. As a result, regarding Sample 16, the surface of the elastic portion was somewhat wavy. The reason for this is considered to be that the elastic portion absorbed the oil or the plasticizer contained in the thermally conductive fluid so as to swell. On the other hand, no change was observed regarding Sample 1 to Sample 15.

Also, regarding noncontact charging, whether charging was able to be performed or not was evaluated by using Wireless Charger Pad QE-TM101 and Wireless USB Mobile Battery QE-PL101 produced by Panasonic Corporation. Specifically, one of Sample 1 to Sample 4 was arranged between Wireless Charger Pad and Wireless USB Mobile Battery and whether charging was able to be performed or not was examined. As a result, charging of each of Sample 1 to Sample 3 did not start and Sample 4 was able to be charged. It is considered that in Sample 1 to Sample 3, the discharge portion of the bottom surface was composed of aluminum and, thereby, the aluminum plate arranged at a location overlapping a charging device blocked electromagnetic waves.

Regarding the stability of the thermally conductive fluid with time of each of Sample 4, Sample 9, Sample 10, Sample 11, Sample 13, Sample 14, and Sample 15, which had the same configuration except that the viscosities of the thermally conductive fluids were different, the state of the thermally conductive fluid after being left to stand for 24 h was examined.

As a result, in Sample 13 and Sample 14 having low viscosities, the state, in which aluminum oxide mixed was somewhat precipitated, was observed. Also, according to comparisons between Sample 13 and Sample 14, the amount of precipitation of Sample 14 was seemed to be small. In this regard, these precipitations were able to be re-dispersed easily by deforming the closed container several times so as to perform agitation. As is clear from these results, the thermally conductive fluid having a viscosity of 870,000 mPa·s or more exhibited good stability with time.

REFERENCE SIGNS LIST 1 liquid-encapsulation heat dissipation member
2 electronic device
3 surface
11 liquid-encapsulation heat dissipation member
11a, 11b, 11c, 11d, 11e liquid-encapsulation heat dissipation member
12 closed container
12a top surface
12b bottom surface
12c, 12d, 12e, 12f side surface
13 thermally conductive fluid
14 elastic portion
15 heat dissipation portion
15a high heat dissipation portion
15b low heat dissipation portion
17 heat dissipation elastic portion
18 protrusion
21a, 21b, 21c liquid-encapsulation heat dissipation member
31a liquid-encapsulation heat dissipation member
51 tester
52 upper case
53 lower case
53a bent portion
54 heating element
55 thermocouple

The invention claimed is:

1. A liquid-encapsulation heat dissipation member; comprising:
 a closed container, and
 a thermally conductive fluid encapsulated in the closed container,
 wherein the closed container includes
  an elastic portion composed of a thin elastomer serving as a surface to come into contact with an electronic device and following the shape of the electronic device,
  a heat dissipation portion composed of a hard material for dissipating the heat from the electronic device through the thermally conductive fluid in the closed container, and
  a heat dissipation elastic portion composed of a thin elastomer serving as a surface to come into contact with a member, which is a target of heat dissipation and following the shape of the member,
 the thermally conductive fluid contains a thermally conductive powder and has a viscosity of 200,000 mPa·s to 3,000,000 mPa·s, and
 the closed container is configured to be placed under the electronic device repeatedly.

2. The liquid-encapsulation heat dissipation member according to claim 1, wherein a surface of the heat dissipation portion is composed of a material different from the material for the remainder surface of the heat dissipation portion and there is a difference in the degree of heat dissipation between the surface of the heat dissipation portion and the remainder surface of the heat dissipation portion.

3. The liquid-encapsulation heat dissipation member according to claim 1, wherein the heat dissipation portion is composed of a metal material having one surface in contact with the thermally conductive fluid and the other surface exposed to the outside.

4. The liquid-encapsulation heat dissipation member according to claim 1,
 wherein the elastic portion is composed of cross-linked rubber or thermoplastic elastomers, and the elastic portion has the hardness of A30 to A60.

5. The liquid-encapsulation heat dissipation member according to claim 1,
 wherein the elastic portion include a mesh and resin film being buried in the wall of the elastic portion.

* * * * *